(12) United States Patent
Foxall et al.

(10) Patent No.: US 6,249,595 B1
(45) Date of Patent: Jun. 19, 2001

(54) ITERATIVE RECONSTRUCTION FOR EPI (75) Inventors: David L. Foxall, Fort Collins, CO (US); Paul R. Harvey, Karkoor (IL); Jian Huang, Poway, CA (US)

(73) Assignee: General Electric Company

(*) Notice: Subject to any disclaimer, the term of this patent is extended or adjusted under 35 U.S.C. 154(b) by 0 days.

(21) Appl. No.: 09/131,905

(22) Filed: Aug. 10, 1998

Related U.S. Application Data (63) Continuation-in-part of application No. 09/010,554, filed on Jan. 22, 1998, now abandoned.

(51) Int. Cl.⁷ .................................................. G06K 9/00
(52) U.S. Cl. ............................................................ 382/128
(58) Field of Search .................................. 382/128, 131, 382/254; 600/410; 128/922

(56) References Cited

U.S. PATENT DOCUMENTS

| | | | |
|---|---|---|---|
| 5,068,609 | 11/1991 | Bruder et al. ........................ | 324/312 |
| 5,089,778 | 2/1992 | Zakhor et al. ....................... | 324/309 |
| 5,113,865 * | 5/1992 | Maeda et al. ........................ | 600/410 |
| 5,151,656 * | 9/1992 | Maier et al. .......................... | 324/309 |
| 5,532,595 * | 7/1996 | Lampman et al. ................... | 324/309 |
| 5,647,362 * | 7/1997 | Fuderer et al. ...................... | 600/410 |
| 5,942,897 * | 8/1999 | Kanazawa ............................ | 324/309 |
| 6,046,590 * | 4/2000 | Hinks et al. ......................... | 324/309 |

OTHER PUBLICATIONS

"A New Phase Correction Method in NMR Imaging Based on Autocorrelation and Histogram Analysis" by C.B. Ahn et al., IEEE Transactions on Medical Imaging, vol. M1–6 Mar. 1987, pp. 32–36.

"Homodyne Detection in Magnetic Resonance Imaging", D.C. Noll et al., in IEEE Transactions on Medical Imaging, vol. 10, No. 2, Jun. 1991, pp. 154–163.

"Numerical Recipes in C: the Art of Scientific Computing", by W. H. Press et al., pp. 293–300, published by Cambridge University Press, 1986.

"Automated Ghost Tuning of Echo Planar Images", M. Kutter et al., SMRM Conference, 1994, p. 836.

"Iterative Correction of Echo Planar Images for T–2 Decay," M. Singh et al., USC, Dept. of Radiology,Los Angeles CA 90033.

"A Fast, Iterative, Partial Fourier Technique Capable of Local Phase Recovery," E.M. Haacke et al., Journal ofMagnetic Resonance 92, 1991, pp. 126–145.

"Improved Automatic Off–Resonance Correction Without a Field Map in Spiral Imaging." L.C. Man et al., MRM 37, 1997, pp. 906–913.

"Real–Time Two–Shot EPI Auto Shim Overall Shimming Polynomials," A. Jesmanowicz and J.S. Hyde, Biophysics Research Institute, Medical College of Wisconsin, Milwaukee, WI.

(List continued on next page.)

*Primary Examiner*—Andrew W. Johns
*Assistant Examiner*—Shervin Nakhjavan
(74) *Attorney, Agent, or Firm*—Hoffman, Wasson & Gitler P.C.; Sanford T. Colb (57) ABSTRACT

A method of iterative reconstruction for MRI imaging, comprising: (a) acquiring data into a k-space, wherein some of said data is acquired using an opposite gradient polarity from other of said data; (b) partially reconstructing at least a portion of the data, using a Fourier transform; (c) test reconstructing, at least a portion of an image, from the partially reconstructed data, using a set of reconstruction parameters, comprising at least one reconstruction parameter; (d) measuring an image quality measure of the test reconstructed image; and (e) automatically repeating (c) and (d) for a plurality of sets of reconstruction parameters to determine an acceptable reconstructed image, using the same partially reconstructed data.

58 Claims, 4 Drawing Sheets

OTHER PUBLICATIONS

"Self–Correcting EPI Reconstruction Algorithm," A. Jesmanowicz, E.C. Wong and J.S. Hyde, Biophysics Research Institute Medical College of Wisconsin, Milwaukee, WI.

"A New Phase Correction Method in NMR Imaging Based on Autocorrelation and Histogram Analysis" by C.B. Ahn et al., IEEE Transactions on Medical Imaging, vol. M1–6 No. 1, Mar. 1987, pp. 32–36.

"Image Reconstruction for Echo Plana Imaging with Non-equidistant k–space Sampling", by H. Bruder et al., Magnetic Resonance in Medicine, vol. 23, pp. 311–323 (1992).

"Ghost Artifact Reduction for Echo Planar Imaging Using Image Phase Correction" by M. H. Buonocore et al., Magnetic Resonance in Medicine, vol. 38, pp. 89–100 (1997).

* cited by examiner

ITERATIVE RECONSTRUCTION FOR EPI

RELATED APPLICATIONS

This application is a continuation-in-part of U.S. patent application Ser. No. 09/010,554, filed Jan. 22, 1998 now abandoned and entitle "Iterafive Reconstruction for EPI", the disclosure of which, including all appendixes thereof, is incorporated herein by reference.

FIELD OF THE INVENTION

This invention is related to MRI image reconstruction and, in particular to an iterative method of reconstruction for EPI imaging.

BACKGROUND OF THE INVENTION

EPI (Echo Planar Imaging) is a fast MRI imaging sequence which enables the acquisition of an image slice in 40 milliseconds or less. In most MRI imaging techniques, including EPI, the process of image acquisition includes the following steps:

(a) placing a patient in a strong, static and homogeneous magnetic field;

(b) applying a sequence of gradients and RF pulses to the patient;

(c) detecting RF radiation emitted by portions of the patient in response to the sequence of (b);

(d) placing the detected data into an array; and (e) applying a two-dimensional FFT to the data in the array to generate an image.

Figure 1:
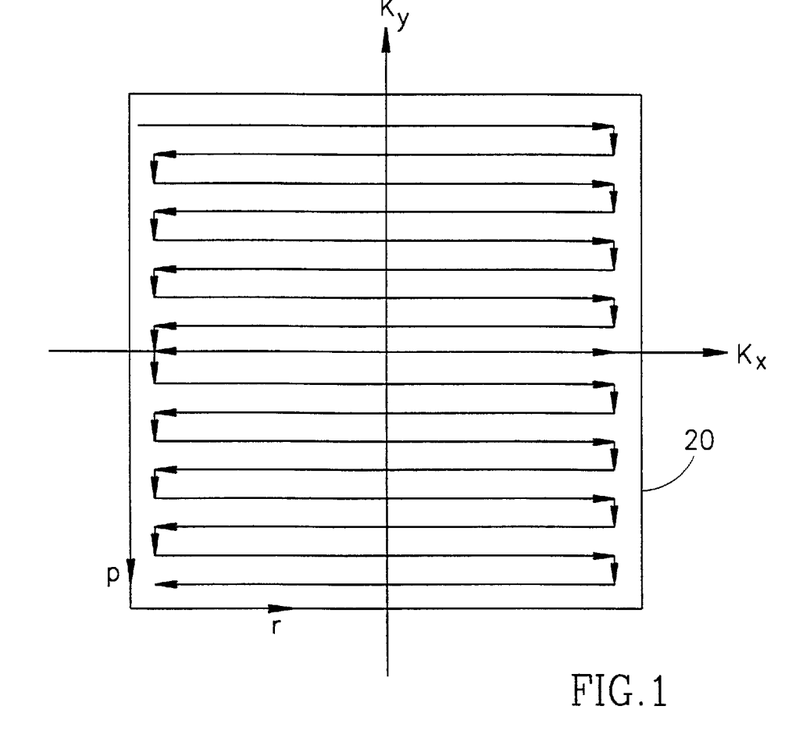
FIG. 1 is a schematic drawing of the transversal of k-space by an EPI sequence.

MRI imaging sequences are usually differentiated by the sequence of (b), which affects the way in which data is sampled and placed in the k-space (d). FIG. 1 illustrates the transversal of a k-space 20 by an exemplary EPI sequence. One of the important attributes of EPI sequences is that odd lines and even lines in the k-space are sampled in opposite directions, by using gradients of opposite polarities. Thus, every other line sample needs to be reversed, before being placed in the k-space matrix. Unfortunately, EPI sequences use very fast gradients which generate eddy currents. Another source of error in EPI images is their sensitivity to main field inhomogenities. Some types of MRI sequences are less sensitive to eddy currents and the like, since all the data lines are sampled in the same direction. As a result, all the data lines are shifted and distorted in a substantially similar manner. In EPI, due to the fact that every other line is reversed, every other line is distorted in a different manner from its neighboring lines. A main type of artifact in EPI images is ghosting, which is caused by the periodic nature of this distortion. The FFT is especially sensitive to periodic distortions in the data. The different effective shifting of odd and even data lines results in the reconstructed image containing both a true image and a ghost of the true image, shifted by half of the field of view.

This ghost forms due to a disruption of the normal cancellation process for image components arising from the odd and even lines of k-space (odd and even components). Phase mismatch between odd and even components leads to interference rather than cancellation. This is evidenced in the typical "Banded" appearance of both ghost and image in EPI pictures obtained with poorly tuned MRI systems. Correcting the phase mismatch in the image domain is mathematically equivalent to correcting certain errors in the k-space data and will correct ghosts which are caused by these certain errors. It should be noted that the errors in sampling k-space arise from many different types of instrument imperfections, most of which are too difficult or too expensive to solve.

It should be appreciated that there are at least two types of phase shift between odd and even components of the image, a constant phase shift that is independent of pixel location (zero order phase shift) and linearly varying phase shifts in the readout and phase encode directions of the image (first order phase shifts). Higher order phase shifts may also be present depending on the severity of the sampling imperfections.

The zero order phase shift is unaffected by the Fourier transform. Thus, correcting the zero order phase shift is exactly equivalent to correcting its corresponding phase error in k-space.

The first order phase shift, particularly that present in the readout image direction arises from the offset between odd and even lines in k-space, due to errors in timing and gradient performance. The FFT translates such an offset into a first order phase shift in the transformed data. Unfortunately, the FFT is very sensitive to even small discrepancies between the odd lines and the even lines.

Many types of phase shift correction techniques are known in the art. A first technique is a reference scan, in which an object, in some cases a phantom and in some cases the object to be imaged, is imaged to determine the distortions of the MRI machine. A correction for these distortion is determined (usually as a template) and then applied to subsequent images.

However, a reference scan is of limited utility for moving structures. In addition, any errors, such as noise, which are acquired with the reference data, are used to "correct" the image data.

In some types of reference scans, the imaging sequence includes acquiring data for use as a reference scan. In FIG. 1, for example, the central echo is acquired twice. Since this echo has no phase encoding, it is more suitable for some types of reference scanning.

In some types of reference scan correction techniques, the reference scan is analyzed to determine numerical values for phase correction, usually only for the lower orders of phase correction. However, applying such a correction indiscriminately may add artifacts to an otherwise acceptable image, especially if these numerical parameters vary substantially over the entire image and/or they are not determined accurately enough.

A general limitation of all reference scan techniques is that there is no method of improving the image beyond what is suggested by the reference scan. Thus, the image quality is always limited by the quality of acquisition of the reference data.

Other artifact reduction techniques modify the EPI data acquisition process. One technique uses the data collected from cycles of the oscillating gradient that have the same gradient polarity. However, this results in a reduced data accumulation rate. Another technique modifies the phase encoding process so that data collected from paired cycles of the oscillating gradient have equal encoding covering one half of k-space. One set of data is conjugated and placed into the missing region of k-space during reconstruction. Unfortunately, this practice significantly increases geometric distortion in the final image.

In some techniques, an operator is invited to manually correct the phase. However, this type of manual correction is time consuming and complicated for the operator to perform.

U.S. Pat. No. 5,068,609 and "Image reconstruction for Echo Planar Imaging with Nonequidistant k-space Sampling", by H. Bruder, H. Fisher, H.-E. Reinfelder and F. Schmitt, in *Magnetic resonance in Medicine,* Vol. 23, pp. 311–323 (1992), the disclosures of which are incorporated herein by reference, describe a method of ghost reduction, wherein a required phase shift between odd and even lines is determined by calculation. In addition, a user is apparently required to select a portion of an image which contains only ghost portions.

"Ghost Artifact Reduction for Echo Planar Imaging Using Image Phase Correction", by Michael H. Buonocore and Lisheng Gao, in Magnetic resonance in Medicine Vol. 38, pp. 89–100 (1997), the disclosure of which is incorporated herein by reference, describes a method of ghost reduction whereby an operator separates an image and a ghost portion and then a phase correction is calculated from odd and even echo images. In addition, this paper, on page 99 thereof de-legitimizes determining a phase correction solely by what is necessary to entirely remove a ghost portion of the image.

"A New Phase Correction Method in NMR Imaging Based on Autocorrelation and Histogram Analysis", by C. B. Ain and Z. H. Cho, in *IEEE Transactions on Medical Imaging* Vol. M1–6, No. 1, March 1987, pp. 32–36, the disclosure of which is incorporated herein by reference, describes a method of calculating a required phase correction from an image, using autocorrelation.

SUMMARY OF THE INVENTION

It is an object of some embodiments of the present invention to provide a method of correcting artifacts in EPI images, which method is not limited by a quality of acquisition of reference scan data.

It is an object of some embodiments of the present invention to provide a method of correcting artifacts in EPI images, without the need to use lengthy calibration and/or expensive adjustments and/or expensive equipment.

It is an object of some embodiments of the present invention to provide a method for improving EPI image reconstruction quality. Preferably, the method is automatic and does not require reference scans and/or templates. Alternatively or additionally, the method corrects zero and/or first order phase errors.

Another object of some embodiments of the invention is to provide a method of reconstruction and ghost reduction, in which little or none of the original signal to noise level is lost in the process of ghost reduction.

In accordance with one preferred embodiment of the invention, an image quality measure is used in conjunction with an iterative reconstruction of an EPI image, which image quality measure determines the quality of the EPI image at each stage of the reconstruction. The image quality measure is preferably used in conjunction with a search technique which searches an n-space of the possible corrections and selects an acceptable correction based on the value of the image quality measure for an EPI image reconstructed using that correction. In a preferred embodiment of the invention, the image quality measure indicates the level of ghosting in the image. Preferably the image quality measure comprises the sum of the magnitudes of the pixels in an image.

The search technique scans an n-dimensional space for a minima and/or a maxima (depending on the image quality measure used). The number of dimensions of the space is defined by the number of different corrections to be applied and its extent is defined by the ranges of values for the corrections. Preferably, each dimension is orthogonal to the other dimensions. A value for the image quality measure can be calculated for images resulting from each possible correction of the data, e.g., for each point in the n-space there is associated a value.

Alternatively to searching until the best possible correction is found, in some cases, the search is stopped when an acceptable image is found. An acceptable image may be determined automatically, for example, it may be an image in which the quality index is within some predefined value. Alternatively, the iteration/search is continued until the reconstructed image is determined to be good enough, relative to the other test reconstructions. Alternatively, an operator can decide to stop the iterative process.

In some embodiments of the invention, specific use is made of correction functions that orthogonalize the search space for zero order and first order correction values. Thus, it is possible to optimize them individually and independently. However, it should be noted that even if this type of technique is not employed, a simultaneous search in two or more dimensions is well within the scope of current technical and computational ability.

In accordance with a preferred embodiment of the invention an EPI image data set is separated into odd and even echo sets. One of the sets is reversed, to correct for its acquisition under a reverse gradient polarization. A complex image is reconstructed from each image set, where the lines with no data are preferably initialized to zero. A test image is created by complex adding at least a portion of the odd image and the even image, wherein one of the images is multiplied by a test phase correction, before being added to the other image. The quality of the test image is determined by applying an image quality measure thereto. The proper correction is determined to be the test correction which yields the highest quality test image, according to the measure. Preferably, starting criteria for the iterative process are determined by analyzing data from a calibration portion of the EPI imaging sequence, to determine an estimated phase error. Alternatively, other methods of estimating a phase error may be used.

Although this method may be used to correct only zero-order or first-order phase shifts, preferably, both zero order phase errors and first order phase errors are corrected. Alternatively or additionally, higher order phase errors, such as second order phase errors are corrected using this method. A higher order phase error may be represented in many convenient manners, including orthonormal polynomials, Fourier series and Chebyshev polynomials. The correction parameters are the coefficients for the representation of the phase error. In one preferred embodiment of the invention, polynomial representations are preferred. Typically, instrumental imperfections yield phase shifts of the polynomial form. In another preferred embodiment of the invention, orthonormal polynomials are used, so that the zero order phase correction may be found independent of the first order phase correction.

In a preferred embodiment of the invention, the image quality measure is used to minimize ghosting. Preferably, the image quality measure is the sum of the absolute values (magnitude) of image pixels in a reconstructed image. Images reconstructed with different phase corrections exhibit constructive and destructive inference between contributions from the odd image and the even image. Taking the magnitude of the pixel values fixes the state of these inference effects by removing phase information and prevents their natural self-cancellation when the pixel values are summed. If the image contains ghost contributions, because the phase corrections do not correctly match the odd and even images, then the sum of the pixel magnitudes will be greater than when phase matching occurs and the ghost cancels.

In accordance with another preferred embodiment of the invention, an image quality measure is applied to an inverse FFT of a one dimensional projection of the test image. Preferably the image quality measure comprises the sum of the coefficients. This measure is maximized in the case where there is no ghosting.

Preferably, instead of reconstructing the entire image, only a region of interest (ROI) of the image is created from the odd and even images, and the image quality measure is applied thereto. Preferably, this ROI comprises a strip of the image. Alternatively, this ROI comprises only a rectangular portion of the image.

In accordance with another preferred embodiment of the invention, the image quality measure is based on the following formula:

$$Q = \sum_p \left| \left( \sum_r |I(r, p)| \cos\phi, \sum_r |I(r, p)| \sin\phi \right) \right|$$

where p is a parameter for the phase encoding axis, r is a parameter for the readout axis, I is the reconstructed image and $\phi$ is an angle between $-\pi$ and $+\pi$, where 0 is the center of the field of view and $-\pi$ and $+\pi$ are the two edges of the field of view, along the phase encoding axis, e.g., $\phi=(p/P)*2\pi-\pi$, where P is the range of the parameter p.

In accordance with another preferred embodiment of the invention, the phase correction for each (pair of) line is separately determined. It should be noted that the correction for one line is a good initial estimate for other lines. Preferably, where a two-dimensional correction template is available, the phase correction values for each line are used as a starting point for the iterative method, for each line.

In accordance with another preferred embodiment of the invention, the determined correction is used as part of a calibration process, to determine a required calibration of an EPI imaging device. Alternatively or additionally, the determined corrections are used as a correction template and/or to determine numerical correction values. In a preferred embodiment of the invention, the corrections for one image are used as the initial estimated corrections for a subsequent image. Alternatively, such corrections may be directly applied to subsequent images.

In accordance with a preferred embodiment of the invention, less than the entire test reconstructed image needs to have its image quality measured. Alternatively or additionally, the test image is reconstructed using only a portion of the data. These types of embodiments are especially useful when using a parallel processor and/or if there is a memory limitation. In a parallel processor a larger plurality of test reconstructions can usually be evaluated by reducing memory requirements. One example of reduced requirements is using only a portion of the k-space for reconstructing the odd and even images. Preferably, a central portion of the k-space is used. In another example, the image quality measure is applied to only a small number of pixels and only they need to be test reconstructed. An extreme case is where only one pixel is test constructed. However, preferably at least two pixels, separated by half a FOV are used, preferably, more than two pixels are used, to overcome problems caused by noise. In one embodiment of the invention, these pixels are randomly selected. Preferably however, each such randomly selected pixel has a paired pixel half a FOV away.

In accordance with a preferred embodiment of the invention, the following iterative method is used to correct ghosting:
(a) creating odd and even k-spaces;
(b) apply a 2D FFT to one of the k-spaces, e.g., the even k-space;
(c) trial phase correct a copy of the even image;
(d) inverse 2D FFT the trial corrected image to obtain a trial even k-space;
(e) add the odd and even k-spaces;
(f) calculate the magnitude of the k-space and sum the line along the phase encode direction which corresponds to the peak of the echo in the odd k-space to calculate a image quality parameter; and
(g) repeat (c)–(f) until the quality parameter is maximum.

In accordance with a preferred embodiment of the invention, the following iterative method is used to correct ghosting:
(a) create odd and even k-spaces;
(b) 1D FFT the k-spaces along the read direction in both data sets;
(c) phase correct a copy of one half-image and add to a copy of the other half-image, as a trial half-image;
(d) 1 D FFT transform the phase encode direction of the trial half-image
(e) evaluate an image quality measure; and
(f) repeat steps (c)–(e) until complete.

In accordance with a preferred embodiment of the invention, the following iterative method is used to correct ghosting:
(a) create odd and even k-spaces;
(b) 1D FFT the k-spaces along the read direction in both data sets;
(c) phase correct a copy of one half-image and add to a copy of the other half-image, as a trial half-image;
(d) inverse FFT transform the read direction of the trial half-image;
(e) magnitude the trial k-space and sum along the central line, to form an image quality measure; and
(f) repeat steps (c)–(w) until complete.

In accordance with another preferred embodiment of the invention, the above described methods of phase correction determination are applied to the results of a non-encoded reference scan. The determine phase corrections are then preferably applied to the entire image. Preferably, the image quality measure used in such a case is the sum of magnitude measure.

As can be appreciated, the above methods have been described mainly with respect to correction of mismatch between FIDs having different phase encodings. However, preferred embodiments of the present invention may also be applied to correct mismatch caused by mismatch between lines in k-space which are perpendicular to the FIDs.

There is therefore provided in accordance with a preferred embodiment of the invention, a method of iterative reconstruction for MRI imaging, comprising:
(a) acquiring data into a k-space, wherein some of said data is acquired using an opposite gradient polarity from other of said data;
(b) partially reconstructing at least a portion of the data, using a Fourier transform;
(c) test reconstructing, at least a portion of an image, from the partially reconstructed data, using a set of reconstruction parameters, comprising at least one reconstruction parameter;

(d) measuring an image quality measure of the test reconstructed image; and (e) automatically repeating (c) and (d) for a plurality of sets of reconstruction parameters to determine an acceptable reconstructed image, using the same partially reconstructed data, wherein (d) comprises automatically selecting at least one ROI of said image and measuring said image quality measure only on said at least one ROI.

Preferably, at least one ROI comprises two ROIs. Preferably, one of said ROIs comprises a center portion of said image and wherein another of said ROIs comprises edge portions of said image. Alternatively or additionally, said two ROIs are spaced half a field of view apart.

In a preferred embodiment of the invention, automatically selecting an ROI comprises manually selecting a first ROI and automatically selecting a second ROI displaced half a field of view from said first ROI.

There is also provided in accordance with a preferred embodiment of the invention, a method of iterative reconstruction for MRI imaging, comprising:

(a) acquiring data into a k-space, wherein some of said data is acquired using an opposite gradient polarity from other of said data;

(b) partially reconstructing at least a portion of the data, representing a complete image, using a Fourier transform;

(c) test reconstructing, at least a portion of an image, from the partially reconstructed data, using a set of reconstruction parameters, comprising at least one reconstruction paranmeter;

(d) measuring an image quality measure of the test reconstructed image; and (e) automatically repeating (c) and (d) for a plurality of sets of reconstruction parameters to determine an acceptable reconstructed image, using the same partially reconstructed data, wherein the image quality measure comprises the sum of the magnitude of the pixels in the reconstructed image.

In a preferred embodiment of the invention, (e) comprises:

(e) automatically repeating (b), (c) and (d) for a plurality of sets of reconstruction parameters to determine an acceptable reconstructed image, using the acquired k-space data.

In a preferred embodiment of the invention, said acquiring comprises preprocessing said data. Preferably, said preprocessing comprises flipping data acquired under opposite polarity.

In a preferred embodiment of the invention, the acceptable image is an optimal image. Alternatively or additionally, the at least one reconstruction parameter comprises at least one phase correction. Alternatively or additionally, test reconstructing an image comprises complex adding an image reconstructed from data of one polarity, with an image reconstructed from data of the opposite polarity, and wherein at least one of the images is processed using the at least one reconstruction parameter. Preferably, said test reconstructing does not comprise repeating said Fourier transform. Alternatively or additionally, acquiring data into a k-space comprises:

acquiring data with one polarity gradient into one array and acquiring data with an opposite polarity gradient into a second array;

reconstructing an image from data of the first polarity gradient; and reconstructing a second image from data of the second polarity gradient.

In a preferred embodiment of the invention, said at least one phase correction comprises a zero order phase correction.

Alternatively or additionally, said at least one phase correction comprises a first order phase correction. Alternatively or additionally, said at least one phase correction comprises a second order phase correction. Alternatively or additionally, automatically repeating (c) and (d) for a plurality of sets of reconstruction parameters, comprises:

first automatically repeating (c) and (d), while modifying a first reconstruction parameter; and second automatically repeating (c) and (d), while modifying a second reconstruction parameter, after said first automatically repeating.

Alternatively or additionally, automatically repeating (c) and (d) for a plurality of sets of reconstruction parameters, comprises:

searching a solution space, whose size and extent are determined by the number and range of said reconstruction parameters, to determine a set of parameters which yields an acceptable image, wherein said search is a multi-dimensional search.

In a preferred embodiment of the invention, the method comprises determining an estimated value of the at least one reconstruction parameter as an initial value for said automatically repeating.

Alternatively or additionally, the method comprises determining an estimated range for said at least one reconstruction parameter as bracket for said automatically repeating.

Alternatively or additionally, when there is an ambiguity between two values for the at least one reconstruction parameter, comprises, analyzing a second moment of images reconstructed using the two values to determine which is the better image.

Alternatively or additionally, test reconstructing comprises reconstructing only a portion of the image. Preferably, the portion comprises a rectangular strip of the image.

Alternatively or additionally, test reconstructing comprises reconstructing only a reference portion of an image.

In a preferred embodiment of the invention, the image quantity measure comprises the sum of the magnitude of the pixels in the reconstructed image. Alternatively or additionally, the image quality measure comprises the sum of the magnitude of FFT coefficients of a projection of the reconstructed image.

There is also provided in accordance with a preferred embodiment of the invention, a method of iterative reconstruction for MRI imaging, comprising:

(a) acquiring data into a k-space, wherein some of said data is acquired using an opposite gradient polarity from other of said data;

(b) partially reconstructing at least a portion of the data, using a Fourier transform;

(c) test reconstructing, at least a portion of an image, from the partially reconstructed data, using a set of reconstruction parameters, comprising at least one reconstruction parameter;

(d) measuring an image quality measure of the test reconstructed image; and (e) automatically repeating (c) and (d) for a plurality of sets of reconstruction parameters to determine an acceptable reconstructed image, using the same partially reconstructed data, wherein the image quality measure comprises the sum of the magnitude of FFT coefficients of a projection of the reconstructed image.

In a preferred embodiment of the invention, the image quality measure comprises the following formula:

$$Q = \sum_{p} \left| \left( \sum_{r} |I(r, p)| \cos\phi, \sum_{r} |I(r, p)| \sin\phi \right) \right|$$

wherein p is a phase encoding axis parameter, r is a readout axis parameter and φ is equal to the distance, along the phase axis, in pixels, of a particular pixel, from the image center, normalized so the entire field of view covers the range $-\pi$ to $\pi$.

There is also provided in accordance with a preferred embodiment of the invention, a method of iterative reconstruction for MRI imaging, comprising:

(a) acquiring data into a k-space, wherein some of said data is acquired using an opposite gradient polarity from other of said data;

(b) partially reconstructing at least a portion of the data, using a Fourier transform;

(c) test reconstructing, at least a portion of an image, from the partially reconstructed data, using a set of reconstruction parameters, comprising at least one reconstruction parameter;

(d) measuring an image quality measure of the test reconstructed image; and (e) automatically repeating (c) and (d) for a plurality of sets of reconstruction parameters to determine an acceptable reconstructed image, using the same partially reconstructed data, wherein the image quality measure comprises the following formula:

$$Q = \sum_{p} \left| \left( \sum_{r} |I(r, p)| \cos\phi, \sum_{r} |I(r, p)| \sin\phi \right) \right|$$

wherein p is a phase encoding axis parameter, r is a readout axis parameter and φ is equal to the distance, along the phase axis, in pixels, of a particular pixel, from the image center, normalized so the entire field of view covers the range $-\pi$ to $\pi$.

In a preferred embodiment of the invention, said image quality measure relates to ghosting.

Alternatively or additionally, said k-space is a three-dimensional k-space.

There is also provided in accordance with a preferred embodiment of the invention, a method of iterative reconstruction for MRI imaging, comprising:

(a) acquiring data into a k-space, wherein some of said data is acquired using an opposite gradient polarity from other of said data;

(b) partially reconstructing at least a portion of the data, using a Fourier transform;

(c) test reconstructing, at least a portion of an image, from the partially reconstructed data, using a set of reconstruction parameters, comprising at least one reconstruction parameter;

(d) measuring an image quality measure of the test reconstructed image; and (e) automatically repeating (c) and (d) for a plurality of sets of reconstruction parameters to determine an acceptable reconstructed image, using the same partially reconstructed data, wherein said k-space is a three-dimensional k-space.

In a preferred embodiment of the invention, said data is acquired in bands and comprising repeating (b)–(e) for at least two of said bands.

In a preferred embodiment of the invention, wherein (b)–(e) are applied to a single planar portion of said k-space and applied to correct at least one additional planar portion of said k-space. Alternatively or additionally, (b)–(e) are applied to a single planar portion of said k-space and applied to correct at least four additional planar portions of said k-space.

In a preferred embodiment of the invention, said data is acquired using a repeating GRASE sequence which interleaves spin-echo and gradient-echo FIDs.

There is also provided in accordance with a preferred embodiment of the invention, a method of iterative reconstruction for MRI imaging, comprising:

(a) acquiring data into a k-space, wherein some of said data is acquired using an opposite gradient polarity from other of said data;

(b) partially reconstructing at least a portion of the data, using a Fourier transform;

(c) test reconstructing, at least a portion of an image, from the partially reconstructed data, using a set of reconstruction parameters, comprising at least one reconstruction parameter;

(d) measuring an image quality measure of the test reconstructed image; and (e) automatically repeating (c) and (d) for a plurality of sets of reconstruction parameters to determine an acceptable reconstructed image, using the same partially reconstructed data, wherein said data is acquired using a repeating GRASE sequence which interleaves spin-echo and gradient-echo FIDs.

In a preferred embodiment of the invention, said interleaving comprises alternating bands, the FIDs of each of which is acquired from substantially a similar portion of the repeating GRASE sequence.

Alternatively or additionally, acquisition of said bands in said GRASE sequence are rearranged to take advantage of said correction. Alternatively or additionally, the method comprises applying (b)–(e) to at least two of said bands.

In a preferred embodiment of the invention, said data is acquired using an EPI sequence. Preferably, said EPI sequence is a single-shot sequence. Alternatively or additionally, said EPI sequence is a multi-shot sequence.

There is also provided in accordance with a preferred embodiment of the invention, a method of iterative reconstruction for MRI imaging, comprising:

(a) acquiring data into a k-space, wherein some of said data is acquired using an opposite gradient polarity from other of said data;

(b) partially reconstructing at least a portion of the data, using a Fourier transform;

(c) test reconstructing, at least a portion of an image, from the partially reconstructed data, using a set of reconstruction parameters, comprising at least one reconstruction parameter;

(d) measuring an image quality measure of the test reconstructed image; and (e) automatically repeating (c) and (d) for a plurality of sets of reconstruction parameters to determine an acceptable reconstructed image, using the same partially reconstructed data, wherein said EPI sequence is a multi-shot sequence.

In a preferred embodiment of the invention, said data is acquired in bands and comprising repeating (b)–(e) for at least two of said bands.

In a preferred embodiment of the invention, said reconstruction parameter comprises a correction for a phase error in said k-space. Alternatively or additionally, said reconstruction parameter is applied by modifying data in said k-space.

There is also provided in accordance with a preferred embodiment of the invention, a method of selecting a suitable region of interest for an MRI image, comprising:

(a) test reconstructing an image, a plurality of times, utilizing a test reconstruction set, the set comprising at least one reconstruction parameter which is modified between the different reconstructions;

(b) selecting at least one region of interest (ROI) of the image; and (c) determining the suitability of the selected region of interest responsive to the dependency of an image quality measure of the ROI on the variations of the test reconstruction parameter.

Preferably, said determining comprises fitting said dependency to a preselected dependency. Preferably, said fitting comprises a least-squares fit.

In a preferred embodiment of the invention, selecting at least one region of interest comprises partitioning the image into a plurality of strips. Alternatively or additionally, determining the suitability comprises analyzing a function dependent on the ROI and on a corresponding ROI, which is distanced by half a field of view from the ROI. Preferably, the function is a sum or a difference of the image quality measure for the two ROIs.

In a preferred embodiment of the invention, the reconstruction parameter is a phase correction. Alternatively or additionally, the image quality measure comprises the sum of the magnitude of the pixels in the ROI.

In a preferred embodiment of the invention, the phase correction is a phase correction for adding two sub-images, one reconstructed from odd data lines and one reconstructed from even data lines.

There is also provided in accordance with a preferred embodiment of the invention, a method of iterative reconstruction for MRI imaging, comprising:

(a) acquiring data into a k-space, wherein at least some of said data is arranged in the k-space in a periodic manner;

(b) partially reconstructing at least a portion of the data, using a Fourier transform;

(c) test reconstructing, at least a portion of an image, from the partially reconstructed data, using a set of reconstruction parameters, comprising at least one reconstruction parameter, wherein said test reconstruction includes modifying data in said k-space;

(d) measuring an image quality measure of the test reconstructed image; and (e) automatically repeating (c) and (d) for a plurality of sets of reconstruction parameters to determine an acceptable reconstructed image, using the same partially reconstructed data.

Preferably, said periodic manner comprises alternating lines in the k-space. Alternatively or additionally, said periodic manner comprises alternating bands in the k-space.

There is also provided in accordance with a preferred embodiment of the invention, an MRI imager utilizing any of the above described methods and/or combinations of the above described methods and/or limitations on the methods.

BRIEF DESCRIPTION OF THE DRAWINGS

The present invention will be more clearly understood from the following detailed description of the preferred embodiments of the invention and from the attached drawings, in which.

DETAILED DESCRIPTION OF THE PREFERRED EMBODIMENTS

Figure 2A:
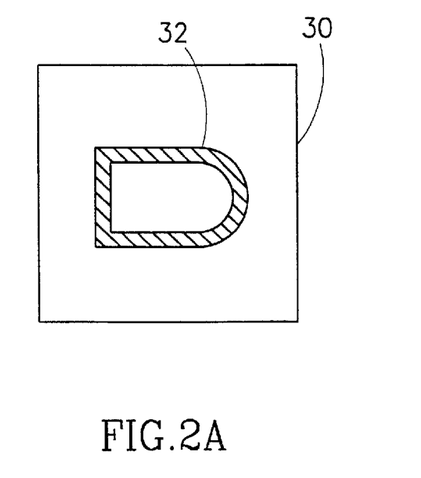
FIGS. 2A and 2B are schematic EPI images with no ghosting and with ghosting, respectively.
Figure 2B:
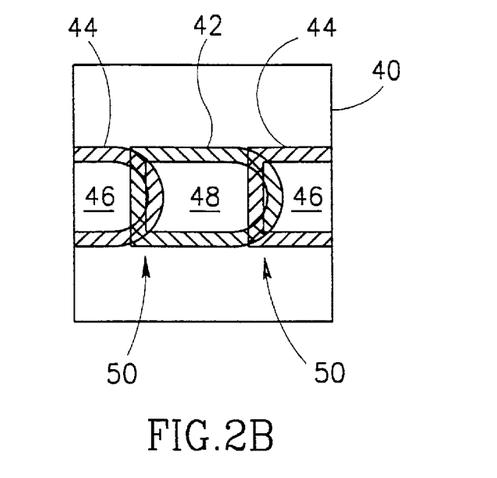

FIG. 2A shows a schematic EPI image 30 of an object 32. FIG. 2B shows a schematic EPI image 40 of an object 42. Image 40 also includes a ghost 44 of object 42. In general, image 40 includes pure image portions 48, pure ghost portions 46 and overlap portions 50. It should be noted that the amount of overlap depends on the particular image. One main cause of ghosts is the difference in acquisition of odd and even lines of k-space 20 (FIG. 1), due to the data in the odd lines being sampled under an opposite polarity of gradient. As a result, the data must be entered into a k-space matrix in an opposite order from even data. Thus, acquisition and timing errors, even small ones, affect the odd lines and the even lines in a different manner. The periodic nature of this distortion is transformed by the FFT into an image exhibiting a banded copy of the true image and a banded ghost, evidence of the underlying phase interference effects between contributions from the mismatched odd and even lines of k-space.

Figure 3:
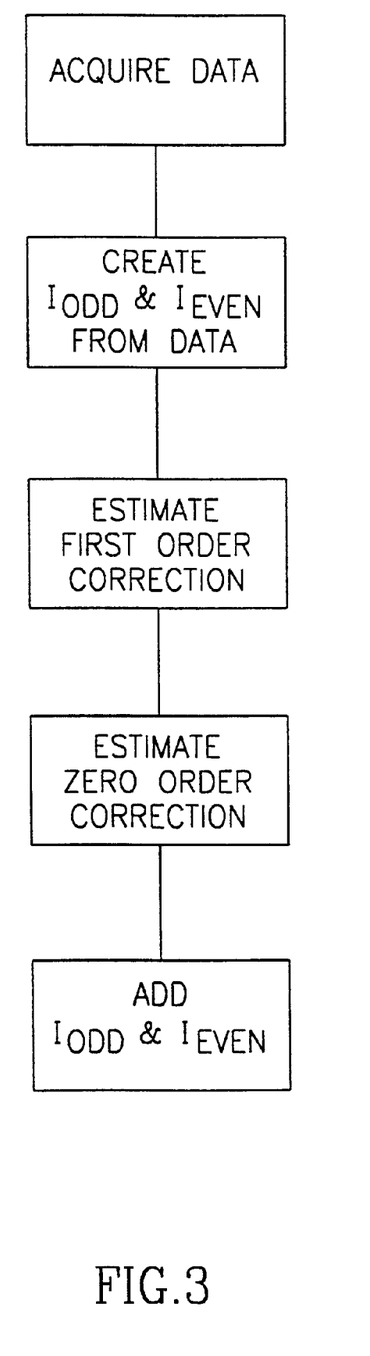
FIG. 3 is a flowchart of a method of reconstruction for EPI, in accordance with a preferred embodiment of the invention.

FIG. 3 is a flowchart of a method of reconstruction for EPI, in accordance with a preferred embodiment of the invention. The method eliminates ghosts by automatically determining a phase correction for the interference between the contributions from the odd lines of k-space and the even lines of k-space. Preferably, the method uses an image quality measure which, when applied to two reconstructions of an image, yields a lower value for the reconstructed image having no ghosts. Using such a method to eliminate ghosts is usually simpler and cheaper than tuning the EPI imaging device so that they are not created in the first place.

In a preferred embodiment of the invention, most of the image reconstruction is performed before- and independent of- the phase mismatch correction. Thus, in a preferred embodiment of the invention, test reconstructing an image with a test phase correction requires a minimum amount of calculation and not, a reconstruction from scratch.

In the process of FIG. 3, the EPI data is acquired and odd and even data lines are stored in separate data arrays. Preferably, one of the data arrays is reversed relative to the other, to correct for sampling under opposite polarity gradients. In these arrays, lines which are not filled with data are preferably initialized to zero. An image is reconstructed from each array using an FFT, $I_{even}$ from the even data lines and $I_{odd}$ from the odd data lines. Each of these images contains an image portion and a ghost portion, due to the zero-data lines. However, if the two reconstructed images are added, the resulting image is equivalent to an FFT of the original k-space data.

In a preferred embodiment of the invention, that provides the optional capability for performing so called partial Fourier reconstruction on data acquired with less than a full set of phase encode lines, the odd and/or even data sets are filtered prior to the FFT. Preferably, the filtering is a ramp filter applied perpendicular to the readout direction. Such a filter, is described, for example, in "Homodyne Detection in Magnetic Resonance Imaging", by Douglas C. Noll, Dwight G. Nishimura and Albert Macovski, in *IEEE Transactions on Medical Imaging,* Vol. 10, No. 2, June 1991, the disclosure of which is incorporated herein by reference. It should be appreciated that it is not necessary, in accordance with a preferred embodiment of the invention, to perform the local phase correction described in the above article.

The first- and zero- order phase corrections are then determined using an iterative reconstruction technique, as described below. Preferably, the first-order correction is determined first, because it varies over a wider range of values and because it typically has a negative effect on the ability to determine the zero-order phase correction. Alternatively, the two corrections are determined simultaneously. Once the proper corrections are determined, the $I_{odd}$ and $I_{even}$ are added, with one of the images being corrected with the phase correction, to yield the reconstructed EPI image:

$$I_{final}(r,p) = I_{even}(r,p) + I_{odd}(r,p) \exp(-iC(r,p)) C(r,p) = Z + F \cdot (r - N/2)/N$$

where, r and p are parameters that index the image data in the readout direction and phase encoding direction, respectively; $C(r,p)$ is the phase correction; Z is the zero order phase correction; F is the first order phase correction and N is the size of the data array (assuming the acquired data comprises NxN samples).

Generally, correcting only the zero order and first order readout errors is sufficient for generating a suitable image. However, in some embodiments of the present invention, correction of the first order phase encoding errors and errors requiring higher phase correction for both axes may be used. Such correction requires simple extension of the definition of $C(r, p)$ above to the general two dimensional polynomial of the desired order. Preferably, the definition of $C(r, p)$ is made in terms of orthogonal polynomials so that the phase correction values remain independent of each other.

In a preferred embodiment of the invention, one or more of the required phase corrections are determined using other methods, such as by numerical analysis of a reference scan. The other phase correction(s) may be determined using the iterative technique described herein. In some cases, the iterative technique will be applied after the images are corrected for the otherwise determined phase error. Alternatively, the iteratively determined phase correction will be determined first, to make the other method more precise. Alternatively, each order phase correction will be independently determined and then applied together to the image.

It should be noted that the iterative correction technique can use any other phase correction determination technique as a starting point. A special virtue of some embodiments of the present invention is that by analyzing what the image should look like, rather than what data was actually acquired, an iterative reconstruction method can achieve a more precise phase correction than that possible by analyzing (noisy) reference scan data.

Figure 4:
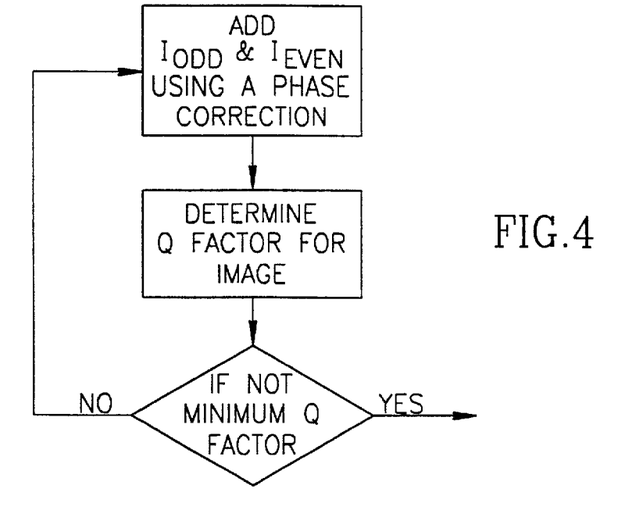
FIG. 4 is a flowchart of a preferred iterative method of determining a phase correction.

FIG. 4 is a flowchart of a preferred iterative method of determining a phase correction. This method is a search method in which the search space comprises the different possible phase corrections and the value at each point in the space is a quality measure, Q, of an image generated using the particular correction. Typically, the search space is two dimensional, representing zero- and first- order phase corrections. Many search techniques are known in the art for rapidly finding a minima or a maxima in a multi-dimensional search space. In a preferred embodiment of the invention, various techniques are used to limit the area of space in which to search and/or to provide a good starting point for the search. In a preferred embodiment of the invention, quality measure Q is minimal at the best correction. Alternatively, Q may be defined such that it is maximal for the best correction.

In a preferred embodiment of the invention, the search is performed on each order of phase correction separately. Preferably, first the order phase correction is determined and then the zero-order correction. Preferably, an initial estimate of the required phase correction is used as a starting point, in which case the values 0.618·estimate and 1.618·estimate are preferably used to bracket the search area. Preferably, estimates are determined using the autocorrelation method of Ahn and Cho, described below. Alternatively, the following method may be used:

(a) the quality measure is determined for phase corrections $+2\pi$ and $-2\pi$;

(b) the point with lowest quality measure (better image) is selected as a starting point;

(c) new test points are generated as, new point=1.618·old point, until a local minima for the quality measure is found;

(d) the points bracketing the local minima are used as an input for a search preferably using the golden section search algorithm, which is defined, inter alia, in "Numerical Recipes: the Art of Scientific Computing", by W. H. Press, B. P. Flannery, S. A. Teukolsky and W. T. Vetterling, pp. 293–298, published by Cambridge University Press 1986, the disclosure of which is incorporated herein by reference.

Once the first order correction is determined and applied to $I_{odd}$, the zero-order phase correction is determined, preferably in a similar manner, and applied to the $I_{odd}$, as well. Preferably, the first order correction is determined again after the zero-order correction is determined. The final image is simply the sum of the $I_{odd}$ and $I_{even}$ after applying the correction. Alternatively, the final image is directly reconstructed by adding $I_{even}$ and $I_{odd}$ with a phase correction. It should be appreciated that $I_{even}$ may be modified instead of $I_{odd}$ when correcting errors, however, $I_{even}$ is usually assumed to include the data with less phase shifting. Alternatively, both the images may be modified.

The zero phase correction is generally between $-\pi$ and $\pi$. Typically, and especially if the apparatus is properly calibrated, the value closer to zero is the proper zero phase correction. In some cases there may be an ambiguity whether the value of the zero order phase correction is correct. Typically, the generated image may be ambiguous between an image which is pure image and an image which is pure ghost. In such cases, the correct value may be selected by a human observer. Alternatively, usually the second moment of the image, calculated relative to the center of the image matrix, is smaller for the true image than for the ghost image. Thus, the correct value for the zero order phase correction is determined by analyzing the second moment of the test images. It should be noted, that proper calibration of the EPI imaging device, and especially gradient coils thereof, usually minimizes the value of the zero-order phase correction. Thus, the value which is closer to zero is usually the correct one.

In a preferred embodiment of the invention an autocorrelation method developed by Ahn and Cho, is used to estimate the first order phase correction. This autocorrelation method is further described in "A New Phase Correction Method in NMR Imaging Based on Autocorrelation and Histogram Analysis", by C. B. Ahn and Z. H. Cho, in *IEEE Trans. Med. Imagine* M1–6, pp. 32–36, 1987, the disclosure of which is incorporated herein by reference. Preferably, the method applied is as follows:

(a) Compute the phase slope of each line in the odd and even images.

(b) Compute the average phase slope for odd and even images, using the sum projection of the respective image:

$$\langle phase\ slope\rangle = \frac{\sum(phase\ slope_i \cdot |projection_i|)}{|projection_i|}$$

(c) The difference between the average phase slope for the odd and even images is the estimate of the first order phase correction. Once the first order correction has been estimated, its effect can be removed from a copy of the original data by multiplying it together with a suitable complex exponential function with a linearly varying argument. This modified data can then be used to estimate the zero order correction. However, in accordance with a preferred embodiment of the invention, a different estimate is used for the zero order correction.

It should be noted that some image quality measures may have one or more local minima for various images, thus, more advanced search techniques, capable of escaping local minima may be required.

In should be noted that the original signal to noise level of the original image is substantially recovered, in spite of the ghost reduction, since each pixel in each of the odd and even images contributes to the final generated image.

In a preferred embodiment of the invention, the image quality measure is the sum of the magnitudes of all the pixels in the test-reconstruction image:

$$Q = \sum_r \sum_p |I_{odd}(r, p) + I_{even}(r, p)\exp(-iC(r, p))|$$

The rationale for this quality measure is that when the image includes a ghost, the sum of the magnitudes is larger than when there is no ghost. For example, when the true image and ghost are not overlapped then it may be shown that:

$$Q = \sum_r \sum_p |I(r, p)|(|\cos((\phi(r, p) - C(r, p))/2)| + |\sin((\phi(r, p) - C(r, p))/2)|)$$

where I(r, p) is the pixel intensity in the true image and φ(r, p) is the pixel phase difference between the odd and even images.

In some cases, such as where there is a large overlap between the ghost and the true image, the above described search methods may fail to find the correct zero phase correction.

Generally, the presence of overlap between the ghost and image makes the search for the minima more difficult, as a function of the amount of overlap. This difficulty may be caused by the |cos()|+|sin()| dependence being degraded as a function of the amount of overlap. Possibly, with very high levels of overlap, new (incorrect) local and/or global minima are created in the search space.

Alternatively or additionally, to correcting the phase shift by multiplying pixels in the odd and/or the even image by a phase correction factor, the phase shift may also be corrected in the k-space domain. In a preferred embodiment of the invention, pixels in the odd and/or even k-spaces are horizontally shifted to compensate for phase shifts in the image.

In a preferred embodiment of the invention, the shift is by whole pixels only. Alternatively or additionally, any shift any/or order of expanding and/or shrinking a line in k-space may be achieved by interpolation. In a preferred embodiment of the invention, each pixel in the target k-space is interpolated from two or four source pixels from the original k-space. The interpolation may be any type of interpolation, including, linear, bi-linear and/or quadric. In a preferred embodiment of the invention, the k-space line may be filtered, for example with a smoothing filter to remove artifacts from the interpolation. Correction in the k-space is especially suitable if a k-space quality measure, for example as described below, is used.

Some ghost artifacts in EPI images may not be corrected by phase correcting odd and even images. In a preferred embodiment of the invention, the iterative methods described herein and/or the quality measures described herein are used to correct these other ghost artifacts. One type of artifact is caused by phase errors in the k-space. Such errors may be caused by eddy currents in MRI coils which modify the main magnetic field. Also, such errors may be caused by a drift of a frequency response of the MRI system. Also this phase error translates as a ghost in the resulting image, and is not generally corrected by phase correcting the odd and even images. These errors are preferably corrected by applying a phase shift correction to odd and/or even k-spaces. Alternatively or additionally, these errors may be corrected by shifting and/or expanding and/or shrinking lines in the image domain (odd and/or even images).

In a preferred embodiment of the invention, the following method is used to correct phase errors in the k-space domain:

(a) provide one of the odd or even k-space domains, for example, by FFT back from a corrected odd or even image;

(b) apply a phase correction to the non-zero lines in the provided k-space;

(c) FFT the phase correction back to the image domain;

(d) add the odd and even images;

(e) apply an image quality measure to the resulting image; and (f) repeating (a)–(e) with different phase correction values until the image quality measure is best and/r within a desired range.

In a preferred embodiment of the invention, the phase correction may be zero, first, second or a higher order phase correction. Preferably, the k-space correction is applied after the image correction is applied. For example, the k-space correction may be applied only if ghosts remain in the image after the image-phase correction. Alternatively or additionally, the k-space correction may be applied before the image-phase correction. Alternatively or additionally, the two correction types are determined simultaneously.

In a preferred embodiment of the invention, instead of applying image quality measure Q to the entire image, Q is applied only to a region of interest of the image (ROI). This modification has two benefits. First, fewer processing steps are required. Second, if the ROI is properly selected, the method will work well even in images with heavy overlap. Preferably, the ROI is selected so that it has a minimum of overlap therein. Since the ghosting is usually only in one axis, the ROIs are preferably image strips This ROI method may be applied to determine zero-order phase corrections and/or first order phase corrections.

Figure 5:
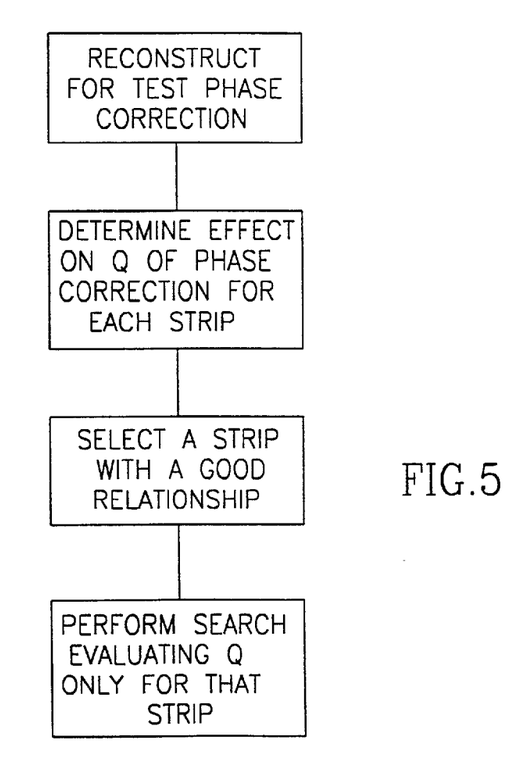
FIG. 5 is a flowchart of a preferred method of selecting a region of interest, in accordance with a preferred embodiment of the invention.

FIG. 5 is a flowchart of a preferred method of selecting a region of interest, in accordance with a preferred embodiment of the invention. This method automatically selects regions in which the dependence of Q on the phase correction enables fast searches. After odd and even images are created, a first-order phase correction is estimated. Then, a test image is created for a plurality of zero order test phase corrections, preferably 16, in the range $-\pi$ to $\pi$, preferably also applying the estimated first order phase correction. Then, the value of Q is determined for a plurality of strips of the image. Preferably, sixteen strips are used, however, even as few as four may be used. The strips are evaluated in pairs half a field of view apart. In strip pairs where there is little overlap, one of the strips will correspond to the pure ghost and one to the pure image. The difference in Q, as a function of the phase correction, between two such strips will be similar to:

$$\Delta Q = |\cos[(\phi(r,p) - C(r,p))/2]| - |\sin[(\phi(r,p) - C(r,p))/2]|$$

where $\phi(r, p)$ is the phase at image pixel (r, p). The sum of the Qs will be similar to:

$$\Sigma Q = |\cos[(\phi(r,p) - C(r,p))/2]| + |\sin[(\phi(r,p) - C(r,p))/2]|$$

In automatic ROI detection, it appears that $\Sigma Q$ is has a sharp cusp in the data near the minimum, making it a better choice for automatic ROI selection.

Overlap strips will generally have a variance in $\Delta Q$ or $\Sigma Q$ more similar to $|\sin|$ or $|\cos|$ plus a constant, with a whole period every $2\pi$ radians, rather than every $4\pi$ radians. Although two strips are preferably compared, it is possible to use only one strip. However, in such a case, there will be an ambiguity between pure ghost and pure image. Such an ambiguity may be solved, inter alia, by user input or by methods described elsewhere in this application.

In a preferred embodiment of the invention, similarity to a $|\cos()|$, $|\sin()|$, $|\sin()|+|\cos()|$ or $|\cos()|-|\sin()|$ dependence is determined by performing a fit to those functions and using a statistical test to determine the quality of the fit. The ROI with the best fit is preferably used. Preferably, the dependency of the sum on the phase correction is estimated using a small number of points and curve fitting, preferably a least squares fitting technique.

Thereafter, the zero phase correction is estimated from the fit of the best pair of ROIs. Thereafter, the first order phase correction is preferably re-estimated, by applying the quality measure on the selected ROIs. Thereafter or simultaneously, the zero-order estimate is preferably re-estimated, by applying the quality measure on the selected ROIs.

One of the following fit definitions are preferably used: least squares, least first power, uniform norm and/or maximum entropy. However, any of the many fit methods known in the art may be used, including, using the partial derivatives of the fit, with respect to the zero order phase correction and/or the second order phase correction.

In accordance with another preferred embodiment of the invention, the image quality measure Q is based on the sum of the magnitude of FFT coefficients. This quality measure is based on the fact than in images with ghosts, alternate FFT coefficients are weaker. Rather than performing an FFT on the entire image, in a preferred embodiment of the invention, the test image is projected unto the phase encode axis and only that projection is analyzed. Preferably, the projection is a projection of the magnitudes. This projection will have the same ghosting problems that the original test image had. The sum of the FFT coefficients of this projection should be maximal when the image has a minimum of ghosting. The negative of the sum will be minimal when the image has a minimum of ghosting, just as in previously defined Q's. In a preferred embodiment of the invention, the same search methodology as described above is used, using the minimum of the negative value of the sum as the search criteria. Preferably this Q is used for determining zero- and/or first-order phase correction.

In accordance with another preferred embodiment of the invention, the following phase correction method is used:

(a) Create of odd and even images.

(b) Estimate first order correction, preferably using the Ahn & Cho method.

(c) Estimate a zero order correction, preferably using the above described FFT based quality measure.

(d) Reconstruct an image from the estimated corrections.

(e) Generate a mask, mask1, from the magnitude of the image of step (d), so that the mask is zero at background (noise) pixels and 1 at image pixels. Preferably this is achieved by assigning the value 1 only to pixels which have a magnitude higher than the mean signal.

(f) Generate a mask, mask2, by shifting mask1 by half a FOV.

(g) generate a mask, mask3, which indicates the overlap pixels, by comparing the sum of the two masks, mask1+mask2, to the value 2. Mask3 is assigned a value of 0 to elements which have the value 2 in the sum of mask1+mask2, and the value of 1 in all the other elements.

(h) Improve the zero and/or first order phase correction using the following quality measure, where I is the phase-corrected image:

$$Q = \sum_r \sum_p mask3(r, p) |I(r, p)|$$

Figure 6:
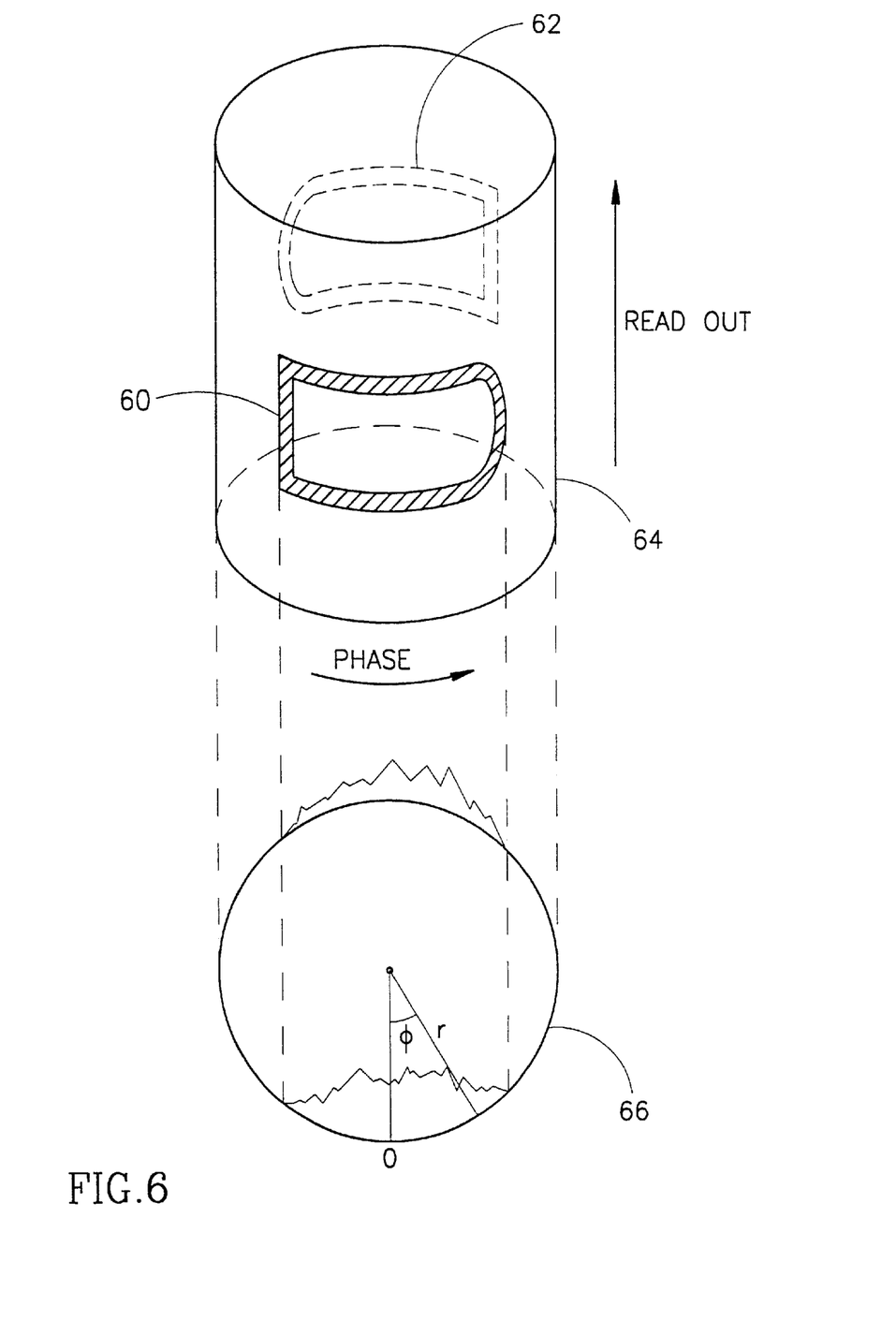
FIG. 6 is a schematic drawing of a cylindrical representation of true and ghost images, in accordance with a preferred embodiment of the invention.

FIG. 6 is a schematic drawing of a cylindrical representation of true and ghost images, in accordance with a preferred embodiment of the invention. The image reconstructed from $I_{even}$ and $I_{odd}$ is arranged unto a cylinder 64, having an axis and a circumference, where the axis corresponds to the phase encoding axis of the image and the circumference corresponds to the readout axis of the image. The left side of the image and the right side of the image meet at the back of cylinder 64. In general, the true image will occupy a portion 60 of the surface of cylinder 64 and the ghost image will occupy a portion 62 of the surface. In cases of overlap between the true and ghost images, there will, of course, be some overlap between the two portions. In this preferred embodiment of the invention, an image quality measure Q is defined in terms of the cylindrical representation. Preferably, instead of applying a measure to the entire cylinder, the information on the surface of cylinder 64 is projected unto the readout axis to form a singe circle of data 66, on which the measure is applied. The quality measure is defined as follows, on the data of circle 66:

$$Q = \sum_p \left| \left( \sum_r |I(r, p)| \cos\phi, \sum_r |I(r, p)| \sin\phi \right) \right|$$

In accordance with a preferred embodiment of the invention, the determined phase corrections are used to fine tune the MRI device. Preferably, the first order correction is used to tune the timing of the gradient coils and the sampling and the zero order phase correction is used to vary the receiver phase between odd and even lines.

It should be noted that all of the above test reconstructions may be performed after the reconstruction FFT, so that an FFT need be applied only once. However, in some embodiments of the invention, the image quality measure is applied before the reconstruction FFT and the FFT is recalculated for each test-reconstruction. Alternatively, in some embodiments of the present invention, the quality measure is applied to only a portion of the k-space data, so once the correction is determined, the entire reconstruction process needs to be performed.

As can be appreciated, the ROIs are defined in cylindrical coordinates, so that a single ROI may take up portions of two extreme ends of the image. In a preferred embodiment of the invention where two spaced apart ROIs are used, the ROIs are fixed to so that one ROI is in the central portion of the image and one ROI occupies portions of the ends of the image. In a preferred embodiment of the invention, the central ROI is defined as a strip whose width is a quarter of the image width and is centered on the image centaur. The second ROI includes two strips of opposite ends of the image, each of which is one eighth of the image width. In a preferred embodiment of the invention, the center of the image is determined either automatically, using methods known in the art or manually, by a user. It should be appreciated that an MRI image is usually center irrespectively of ghost correction, to better display the image.

Iterative correction of phase errors is not limited to single-shot EPI. In a preferred embodiment of the invention, the above described methods are applied to multi-shot interleaved EPI. In one preferred embodiment of the invention, a separated pair of images is created from data lines acquired using opposite gradient polarity. Unlike single-shot EPI, in interleaved EPI, the separated k-space data sets will typically comprise bands of data, separated by bands of zeroed areas, rather than single lines of data. Thereafter, the above described methods for phase correction may be applied, preferably utilizing the FFT-projection quality measure.

In another preferred embodiment of the invention, phase mismatch between the different EPI sequences is also corrected for, by creating a separate image from each set of data acquired by a different EPI shot. This correction may be applied before, after or simultaneous with the correction for the mismatch due to the effects of gradient reversal. Preferably, the above described FFT-projection quality measure is used to determine if the phase correction is appropriate.

In accordance with another preferred embodiment of the invention, the above described methods are applied to GRASE imaging. These methods may be applied directly to correct a phase mismatch between the different portions of k-space, which are acquired differently. Alternatively, this iterative type of ghost reduction may be applied to modify the GRASE imaging sequence. In conventional GRASE sequences, k-space is filled in a banded fashion, similar to interleaved EPI, so as to minimize the frequency of the periodic disturbance caused by using data acquired with different gradient polarities. This usage of the data reduces ghosting artifacts at the expense of blurring the image due to amplitude discontinuities present at the band boundaries that arise from natural T2 decay effects in GRASE echo trains. Iterative phase correction relives the need to employ such data ordering. In accordance with a preferred embodiment of the invention, separated k-spaces are created for data lines obtained with opposite gradient polarity, regions of missing data being zeroed. The k-spaces are then preferably Fourier transformed and the above described methods for iterative phase correction are applied.

In accordance with another preferred embodiment of the invention, the above described correction methods are applied to 3D EPI. Such a sequence fills a 3D k-space which has readout, phase encode and section axes. In a multi-shot 3D EPI sequence, the k-space is preferably filled using bands, each of the bands being the result of a single shot, with ghost corrected as described above. Alternatively, the k-space is divided into a plurality of sub-spaces, such as the odd planes and the even planes, each of which sub-space is acquired under different conditions, and a phase correction is determined in an iterative manner, as described above. However, rather than use a 2D FFT to generate the odd and even images, a 3D FFT is used, in addition, the formula for combining the odd and even images is preferably similar to the ones used for 2D EPI, except that it can depend on up to three parameters:

$$I_{final} = I_{odd}(r,p,s) + \exp(-iC(r,p,s))I_{even}(r,p,s)$$

The following details should preferably be applied to the above described quality measures for the 3D case. The sum magnitude measure is preferably unchanged and used in cases of low overlap. The projection-magnitude method is preferably applied by first projecting a test image onto a 2D plane, preferably bounded either by the readout and phase encode axes or the section encode and phase encode axes and then projecting the resulting 2D plane onto a phase encode axis. The ROI based method is preferably applied by selecting a pair of boxes (rather than 2D segments), each ROI of which is parallel to the read and section axes. The two ROIs are parallel in the phase encode axis and are preferably selected in corresponding positions half a FOV apart.

In an alternative embodiment of the invention, at least one shot is obtained so that it corresponds to a 2D section of the k-space, preferably with no section encoding. A correction is determined for this shot and that correction is preferably applied to the rest of the acquired data. As can be appreciated, the above method of ghost reduction may be applied to many sequences not specifically described above, including other 3D sequences, such as EPI, especially those using other types of axis encodings and/or other assignments of encodings to axes, combined EPI and GRASE and other sequences known in the art. In some cases, the correction for one plane may not be appropriate for other planes. This unsuitability may be the result of the heating of gradient coils, which varies artifacts caused by them, as a function of the portion of k-space being acquired. Preferably, the determined corrections are applied to a k-space portion responsive to a time delay between the acquisition of the data used for determining correction and the acquisition of the k-space portion. Alternatively or additionally, the suitability of the correction may be periodically determined, for example using one of the above image quality measures, to determine if a new correction is required. Alternatively or additionally, a different correction is applied for each scan, especially individual scans (shots) in a multi-shot EPI sequence.

It will be appreciated by a person skilled in the art that the scope of the present invention is not limited by what has thus far been described. Rather, the scope of the invention is limited only by the claims which follow.

What is claimed is:

1. A method of iterative reconstruction for MRI imaging comprising:

(a) acquiring data into a k-space, wherein some of said data is acquired using an opposite gradient plurality from other of said data;

(b) reconstructing at least a portion of the data using a Fourier Transform;

(c) test reconstructing at least a portion of an image, from the portion of the reconstructed data, using a set of reconstruction parameters, comprising at least one reconstruction parameter wherein said least one reconstruction parameter comprises at least one phase correction;

(d) measuring an image quality measure related to ghosting of the test reconstructed image;

(e) automatically repeating (c) and (d) for a plurality of sets of reconstruction parameters to acquire an acceptable reconstructed image using the same reconstructed data of at least a portion of the data, wherein (d) comprises automatically selecting at least one region of interest (ROI) of said image and measuring said image quality measure only on said at least one ROI.

2. A method according to claim 1, wherein at least one ROI comprises two ROIs.

3. A method according to claim 2, wherein one of said ROIs comprises a center portion of said image and wherein another of said ROIs comprises edge portions of said image.

4. A method according to claim 2, wherein said two ROIs are spaced half a field of view apart.

5. A method according to claim 1, wherein automatically selecting an ROI comprises manually selecting a first ROI and automatically selecting a second ROI displaced half a field of view from said first ROI.

6. A method according to claim 1, wherein (e) comprises:

(e) automatically repeating (b), (c) and (d) for a plurality of sets of reconstruction parameters to determine an acceptable reconstructed image, using the acquired k-space data.

7. A method according to claim 1, wherein said acquiring comprises preprocessing said data.

8. A method according to claim 7, wherein said preprocessing comprises flipping data acquired under opposite polarity.

9. A method according to claim 1, wherein the acceptable image is an optimal image.

10. A method according to claim 1, wherein test reconstructing an image comprises complex adding an image reconstructed from data of one polarity, with an image reconstructed from data of the opposite polarity, and wherein at least one of the images is processed using the at least one reconstruction parameter.

11. A method according to claim 10, wherein said test reconstructing does not comprise repeating said Fourier transform.

12. A method according to claim 10, wherein acquiring data into a k-space comprises:

acquiring data with one polarity gradient into one array and acquiring data with an opposite polarity gradient into a second array;

reconstructing an image from data of the first polarity gradient; and reconstructing a second image from data of the second polarity gradient.

13. A method according to claim 1, wherein said at least one phase correction comprises a zero order phase correction.

14. A method according to claim 1, wherein said at least one phase correction comprises a first order phase correction.

15. A method according to claim 1, wherein said at least one phase correction comprises a second order phase correction.

16. A method according to claim 1, wherein automatically repeating (c) and (d) for a plurality of sets of reconstruction parameters, comprises:

first automatically repeating (c) and (d), while modifying a first reconstruction parameter; and second automatically repeating (c) and (d), while modifying a second reconstruction parameter, after said first automatically repeating.

17. A method according to claim 1, wherein automatically repeating (c) and (d) for a plurality of sets of reconstruction parameters, comprises:

searching a solution space, whose size and extent are determined by the number and range of said reconstruction parameters, to determine a set of parameters which yields an acceptable image, wherein said search is a multi-dimensional search.

18. A method according to claim 1, comprising determining an estimated value of the at least one reconstruction parameter as an initial value for said automatically repeating.

19. A method according to claim 1, comprising determining an estimated range for said at least one reconstruction parameter as bracket for said automatically repeating.

20. A method according to claim 1, wherein, when there is an ambiguity between two values for the at least one reconstruction parameter, comprises, analyzing a second moment of images reconstructed using the two values to determine which is the better image.

21. A method according to claim 1, wherein test reconstructing comprises reconstructing only a portion of the image.

22. A method according to claim 21, wherein the portion comprises a rectangular strip of the image.

23. A method according to claim 1, wherein test reconstructing comprises reconstructing only a reference portion of an image.

24. A method according to claim 1, wherein the image quality measure comprises the sum of the magnitude of the pixels in the reconstructed image.

25. A method according to claim 1, wherein the image quality measure comprises the sum of the magnitude of FFT coefficients of a projection of the reconstructed image.

26. A method according to claim 1, wherein said k-space is a three-dimensional k-space.

27. A method according to claim 1, wherein said data is acquired using a repeating GRASE sequence which interleaves spin-echo and gradient-echo FIDs.

28. A method according to claim 27, wherein said interleaving comprises alternating bands, the FIDs of each of which is acquired from substantially a similar portion of the repeating GRASE sequence.

29. A method according to claim 28, wherein acquisition of said bands in said GRASE sequence are rearranged to take advantage of said correction.

30. A method according to claim 28, comprising applying (b)–(e) to at least two of said bands.

31. A method according to claim 1, wherein said data is acquired using an EPI sequence.

32. A method according to claim 31, wherein said EPI sequence is a single-shot sequence.

33. A method according to claim 31, wherein said EPI sequence is a multi-shot sequence.

34. A method according to claim 33, wherein said data is acquired in bands and comprising repeating (b)–(e) for at least two of said bands.

35. A method according to claim 1, wherein said reconstruction parameter comprises a correction for a phase error in said k-space.

36. A method according to claim 1, wherein said reconstruction parameter is applied by modifying data in said k-space.

37. A method of iterative reconstruction for MRI imaging, comprising:
(a) acquiring data into a k-space, wherein some of said data is acquired using an opposite gradient polarity of some other of said data;
(b) partially reconstructing at least a portion of the data representing a complete image using a Fourier Transform;
(c) test reconstructing at least a portion of an image, from the partially reconstructed data using a set of reconstruction parameters comprising at least one reconstruction parameter;
(d) measuring an image quality measure of the test reconstructed image wherein said image quality measure relates to ghosting; and
(e) automatically repeating (c) and (d) for a plurality of sets of reconstruction parameters to determine an acceptable reconstructed image, using the same partially reconstructed data, wherein the image quality measure the sum of the magnitude of the pixels in the reconstructed image.

38. A method of iterative reconstitution for MRI imaging, comprising:
(a) acquiring data into a k-space, wherein some of said data is acquired using an opposite gradient polarity from other of said data;
(b) partially reconstructing at least a portion of the data using a Fourier Transform wherein said portion of the data may be less than half of the data representing the complete image;
(c) test reconstructing at least portion of the image from the partially reconstructed data, using a set of reconstruction parameters comprising at least one reconstruction parameter,
(d) measuring an image quality measure of the test reconstructed image; and
(e) automatically repeating (c) and (d) for a plurality of set of reconstruction parameters to determine an acceptable reconstructed image, using the same partially reconstructed data, wherein the image quality measure comprises the sum of the magnitude of FFT coefficients of the projection of reconstructed image.

39. A method of iterative reconstruction for MRI imaging, comprising:
(a) acquiring data into a k-space, wherein some of said data is acquired using an opposite gradient polarity from other of said data;
(b) partially reconstructing at least a portion of the data, using a Fourier transform;
(c) test reconstructing, at least a portion of an image, from the partially reconstructed data, using a set of reconstruction parameters, comprising at least one reconstruction parameter;
(d) measuring an image quality measure of the test reconstructed image; and
(e) automatically repeating (c) and (d) for a plurality of sets of reconstruction parameters to determine an acceptable reconstructed image, using the same partially reconstructed data,
wherein the image quality measure comprises the following formula:

$$Q = \sum_p \left| \left( \sum_r |I(r, p)| \cos\phi, \sum_r |I(r, p)| \sin\phi \right) \right|$$

wherein p is a phase encoding axis parameter, r is a readout axis parameter and $\phi$ is equal to the distance, along the phase axis, in pixels, of a particular pixel, from the image center, normalized so the entire field of view covers the range $-\pi$ to $\pi$.

40. A method of iterative reconstruction for MRI imaging, comprising:
(a) acquiring data into a k-space, wherein some of said data is acquired using an opposite gradient polarity from other of said data;
(b) partially reconstructing at least a portion of the data, using a Fourier transform;
(c) test reconstructing, at least a portion of an image, from the partially reconstructed data, using a set of reconstruction parameters, comprising at least one reconstruction parameter;
(d) measuring an image quality measure related to ghosting of the test reconstructed image; and
(e) automatically repeating (c) and (d) for a plurality of sets of reconstruction parameters to determine an acceptable reconstructed image, using the same partially reconstructed data,
wherein said k-space is a three-dimensional k-space.

41. A method according to claim 40, wherein said data is acquired in bands and comprising repeating (b)–(e) for at least two of said bands.

42. A method according to claim 40, wherein (b)–(e) are applied to a single planar portion of said k-space and applied to correct at least one additional planar portion of said k-space.

43. A method according to claim 40, wherein (b)–(e) are applied to a single planar portion of said k-space and applied to correct at least four additional planar portions of said k-space.

44. A method of iterative reconstruction for MRI imaging, comprising:
(a) acquiring data into a k-space, wherein some of said data is acquired using an opposite gradient polarity from other of said data;
(b) partially reconstructing at least a portion of the data, using a Fourier transform;
(c) test reconstructing, at least a portion of an image, from the partially reconstructed data, using a set of reconstruction parameters, comprising at least one reconstruction parameter;
(d) measuring an image quality measure of the test reconstructed image; and
(e) automatically repeating (c) and (d) for a plurality of sets of reconstruction parameters to determine an acceptable reconstructed image, using the same partially reconstructed data,
wherein said data is acquired using a repeating GRASE sequence which interleaves spin-echo and gradient-echo FIDs.

45. A method of iterative reconstruction for MRI imaging, comprising:
(a) acquiring data into a k-space, wherein some of said data is acquired using an opposite gradient polarity from other of said data;

(b) partially reconstructing at least a portion of the data, using a Fourier transform;

(c) test reconstructing, at least a portion of an image, from the partially reconstructed data, using a set of reconstruction parameters, comprising at least one reconstruction parameter;

(d) measuring an image quality measure of the test reconstructed image; and (e) automatically repeating (c) and (d) for a plurality of sets of reconstruction parameters to determine an acceptable reconstructed image, using the same partially reconstructed data, wherein said EPI sequence is a multi-shot sequence.

46. A method of selecting a suitable region of interest for an MRI image, comprising:

(a) test reconstructing an image, a plurality of times, utilizing a test reconstruction set, the set comprising at least one reconstruction parameter which is modified between the different reconstructions;

(b) selecting at least one region of interest (ROI) of the image; and (c) determining the suitability of the selected region of interest responsive to the dependency of an image quality measure of the ROI on the variations of the test reconstruction parameter.

47. A method according to claim 46, wherein said determining comprises fitting said dependency to a preselected dependency.

48. A method according to claim 47, wherein said fitting comprises a least-squares fit.

49. A method according to claim 46, wherein selecting at least one region of interest comprises partitioning the image into a plurality of strips.

50. A method according to claim 46, wherein determining the suitability comprises analyzing a function dependent on the ROI and on a corresponding ROI, which is distanced by half a field of view from the ROI.

51. A method according to claim 50, wherein the function is a sum or a difference of the image quality measure for the two ROIs.

52. A method according to claim 46, wherein the reconstruction parameter is a phase correction.

53. A method according to claim 52, wherein the phase correction is a phase correction for adding two sub-images, one reconstructed from odd data lines and one reconstructed from even data lines.

54. A method according to claim 46, wherein the image quality measure comprises the sum of the magnitude of the pixels in the ROI.

55. A method of iterative reconstruction for MRI imaging, comprising:

(a) acquiring data into a k-space, wherein at least some of said data is arranged in the k-space in a periodic manner;

(b) partially reconstructing at least a portion of the data, using a Fourier transform;

(c) test reconstructing, at least a portion of an image, from the partially reconstructed data, using a set of reconstruction parameters, comprising at least one reconstruction parameter, wherein said test reconstruction includes modifying data in said k-space;

(d) measuring an image quality measure of the test reconstructed image; and (e) automatically repeating (c) and (d) for a plurality of sets of reconstruction parameters to determine an acceptable reconstructed image, using the same partially reconstructed data.

56. A method according to claim 55, wherein said periodic manner comprises alternating lines in the k-space.

57. A method according to claim 55, wherein said periodic manner comprises alternating bands in the k-space.

58. A method of iterative reconstruction for MRI imaging, comprising:

(a) acquiring data into a k-space, wherein some of said data is acquired using an opposite gradient plurality from other said gradient;

(b) partially reconstructing at least a portion of the data using a Fourier Transform;

(c) test reconstructing at least a portion of the image, from the partially reconstructed data, using a set of reconstruction parameters, comprising at least one reconstruction parameter;

(d) measuring an image quality measure of the test reconstructed image, wherein the image quality measure comprises the following formula:

$$Q = \sum_p \left| \left( \sum_r |I(r, p)|\cos\phi, \sum_r |I(r, p)|\sin\phi \right) \right|$$

wherein p is a phase encoding axis parameter, r is a readout axis parameter and $\phi$ is equal to the distance, along the phase axis, in pixels, of a particular pixel, from the image center, normalized so the entire field of view covers the range $-\pi$ to $\pi$;

(e) automatic repeating (c) and (d) for a plurality of sets of reconstruction parameters to determine an acceptable reconstruction image, using the same partially reconstructed data, wherein (d) comprises automatically selecting at least one ROI of said image and measuring said image quality measure only on said at least one RIO.

* * * * *